United States Patent [19]

Metroka

[11] Patent Number: 5,045,824
[45] Date of Patent: Sep. 3, 1991

[54] DIELECTRIC FILTER CONSTRUCTION

[75] Inventor: Michael P. Metroka, Algonquin, Ill.

[73] Assignee: Motorola, Inc., Schaumburg, Ill.

[21] Appl. No.: 577,172

[22] Filed: Sep. 4, 1990

[51] Int. Cl.$^5$ ............................................. H01P 1/202
[52] U.S. Cl. ..................................... 333/206; 333/202; 361/414
[58] Field of Search ............... 333/202, 206, 207, 222, 333/223, 219, 247; 361/401, 403, 414, 412

[56] References Cited

U.S. PATENT DOCUMENTS

| | | | |
|---|---|---|---|
| 3,417,294 | 12/1968 | Steidlitz | 361/401 |
| 4,703,291 | 10/1987 | Nishikawa et al. | 333/202 |
| 4,724,283 | 2/1988 | Shimada et al. | 361/414 X |
| 4,879,533 | 7/1989 | de Muro et al. | 333/202 X |
| 4,945,323 | 7/1990 | Gerstenberg et al. | 361/414 X |
| 4,983,938 | 1/1991 | Sasaki et al. | 333/207 |

FOREIGN PATENT DOCUMENTS

| | | | |
|---|---|---|---|
| 0143002 | 7/1985 | Japan | 333/202 |
| 0260203 | 12/1985 | Japan | 361/401 |
| 0043904 | 2/1987 | Japan | 333/202 |
| 0250901 | 10/1988 | Japan | 333/202 |
| 0053605 | 3/1989 | Japan | 333/202 |

Primary Examiner—Eugene R. LaRoche
Assistant Examiner—Seung Ham
Attorney, Agent, or Firm—Robert H. Kelly

[57] ABSTRACT

A ceramic filter mountable on a multi-layer circuit board. The filter contains a two-level mounting surface for matingly engaging with a circuit board. One surface portion of the two-level mounting surface extends through a recessed area formed upon a surface of the circuit board. By mounting the filter such that the mounting surface matingly engages with the recessed area of the circuit board, the heightwise requirement of the filter above the surface of the circuit board is reduced.

33 Claims, 5 Drawing Sheets

DIELECTRIC FILTER CONSTRUCTION

BACKGROUND OF THE INVENTION

The present invention relates generally to dielectric filters, and, more particularly, to a dielectric filter which may be directly mounted upon a surface, such as a printed circuit board.

The design of and use of filter circuitry for filtering signals of undesired frequency components is well known. For example, elementary filter circuits performing bandpass, band reject, low pass, high pass, and combinations thereof are all well-known and are utilized to form portions of electrical circuits to pass (or reject) certain frequency portions of signals supplied to the filter circuit.

Filter circuits may be comprised of either active or passive filter components. An active filter component may be advantageously embodied in an integrated circuit, but an active filter is generally linear over only a limited dynamic range. Additionally, an active filter component exhibits proper filter characteristics over only the limited dynamic range. More conventionally, filter circuits are comprised of passive filter components, such as combinations of resistors, capacitors, and inductors. The resistive, capacitive, and inductive component values of the passive filter components, and their electrical connection therebetween, define a resonant frequency of the filter circuit. The passive filter components may be connected in manners, and may be of resistive, capacitive, and inductive values, to form a filter circuit, such as any of the above-listed filter circuits, for passing (or rejecting) signal portions of any desired frequencies.

For example, filter circuits forming a portion of an electrical circuit may be positioned in a series connection with the electrical circuit. As mentioned hereinabove, the values of the filter components and their electrical connection therebetween defines a resonant frequency. When the filter circuit is connected in a series connection with other portions of the electrical circuit, signal portions of a signal supplied to the filter circuit within the resonant frequency defined by the filter circuit are passed by the filter circuit. By appropriate selection of the component values of the components of the filter circuit as well as their electrical connection therebetween, a passband filter circuit, for example, may be constructed to pass signal portions of any desired frequencies.

Filter circuits forming a portion of an electrical circuit may also be positioned in a shunt connection with other portions of the electrical circuit (i.e., be positioned to extend between the electrical circuit and a ground plane). As mentioned hereinabove, the values of the filter component and their electrical connection therebetween defines a resonant frequency. When the filter circuit is connected in a shunt connection with the electrical circuit, signal portions of a signal supplied to the filter circuit within the resonant frequency defined by the filter circuit are shunted to ground by the filter circuit. By appropriate selection of component values of the components of the filter circuit, as well as their electrical connection therebetween, a band reject filter circuit, for example, may be constructed to reject signal portions of any desired frequencies.

An electrical circuit may also contain combinations of both series and shunt filter circuits to perform circuit functions as desired.

Electrical circuits which utilize filter circuitry to form a portion thereof include radio frequency receiver circuits. Filter circuitry is utilized in a radio frequency receiver circuit to tune the receiver, and, additionally, to filter intermodulation spurs generated during down conversion of a received signal. While an ideal receiver reproduces only the signal transmitted thereto, an actual, nonideal receiver, through a process of mixing occurring during down conversion of a received signal, produces intermodulation distortion. Associated with intermodulation distortion are undesired spurious signals generated during down conversion of a signal received by a nonideal receiver. Such undesired, spurious signals are the intermodulation spurs referred to hereinabove. Filter circuits may, of course, be utilized by the receiver circuits to perform other filter functions.

Ceramic, and other dielectric filters, are oftentimes utilized to form passive filter circuits. Such filter circuits, frequently referred to as ceramic block filters due to the geometry of most of such filters, are advantageously utilized to form a passive filter circuit as a single ceramic block may be formed to comprise a filter. The ceramic block filter may be connected in series, or in shunt, to perform a filter function as desired. Typically, the filter is formed in the shape of a block, and one or more holes are drilled or otherwise created to extend into the block. Portions of the sidewalls defining the hole are coated with an electrically conductive material; additionally, surface portions of the ceramic block are also covered with an electrically conductive material. The holes drilled to extend into, or through, the dielectric block, once coated with the electrically conductive material, form resonators of characteristics defined by the length and surface area of the sidewalls which define the resonator. While the resonators may extend in any direction, typically, the resonators are formed to extend from the front portion to the rear portion or to extend between opposing side portions of the block.

U.S. Pat. Nos. 4,431,977 and 4,742,562 disclose examples of such ceramic block filters. The ceramic block filters disclosed in the aforementioned two patents are coupled to an electrical circuit by integral, conventional coupling connectors, and integral coaxial coupling cables, respectively. U.S. Pat. No. 4,673,902 discloses a ceramic block filter which is coupled directly to an electrical circuit by a direct solder connection, thereby obviating the need for coaxial cable to connect the ceramic block filter to the circuit. Additionally, the ceramic block filter is susceptible to movement when the solder becomes liquid during the solder reflow operations. Such movement can result in inadequate electrical connection of the filter to the electrical circuit and other misalignment problems.

What is needed, therefore, is a ceramic block filter construction which, once positioned upon the circuit board, does not become misaligned during solder reflow operations.

Additionally, U.S. Pat. No. 4,703,291 discloses a ceramic block filter in which wires interconnect the resonators of the ceramic block filter and the electrical circuit. U.S. Pat. No. 4,716,391 discloses a ceramic block filter in which wires interconnect the resonators formed in the ceramic block filter and input/output pads.

Because many electrical devices are packaged in ever-smaller housings, the electrical circuits comprising portions of the electrical devices must be miniaturized in order to fit within the ever-smaller housings. For example, portable transceivers, such as portable, cellular phones, are increasingly miniaturized to permit the transceivers to be of ever-smaller dimensions. Because of the block-like shape of a ceramic block filter, when the ceramic block filter forms a portion of an electrical circuit disposed upon a circuit board, a minimum heightwise spacing is required above the circuit board to permit positioning of the ceramic block filter thereupon. This heightwise spacing required to permit positioning of the ceramic block filter upon a circuit board may limit the miniaturization permitted of an electrical device. Therefore, attempts have been made to most efficiently position a ceramic block filter upon a circuit board to permit continued miniaturization of an electrical device. For instance, U.S. patent application Ser. No. 455,062 filed on Dec. 22, 1989, discloses a surface mount filter which is positioned to extend through an opening of dimensions to permit insertion of the ceramic block filter therethrough. A bracket is positioned about the ceramic block filter to affix the filter to the circuit board. The necessity of a bracket, however, requires an extra production step during production of the electrical circuit, thereby increasing production costs of the electrical circuit.

What is needed, therefore, is a filter mountable upon a support surface, such as a circuit board, which minimizes the heightwise requirements of the filter when mounted thereupon, and which, at the same time, may be mounted in position in a manner which minimizes production costs.

SUMMARY OF THE INVENTION

It is, accordingly, an object of the present invention to provide a filter mountable upon a support surface which minimizes the heightwise requirements of the filter when mounted thereupon.

It is a further object of the present invention to provide a dielectric block filter mountable upon a support surface which may be reliably and inexpensively connected to an electrical circuit.

It is a yet further object of the present invention to provide a dielectric block filter which may be easily, and reliably, positioned and maintained in alignment with an electrical circuit disposed upon a circuit board.

In accordance with the present invention, therefore, a filter mountable upon a support surface for generating filtered signals of desired frequencies responsive to application of an input signal thereto is disclosed. The filter includes a dielectric block having at least one cavity extending along at least a portion of the dielectric block to form a resonator thereby. The dielectric block has at least one mounting surface for matingly engaging with the support surface to mount the dielectric block in position thereat. An input signal is supplied to the resonator of the dielectric block.

BRIEF DESCRIPTION OF THE DRAWINGS

The present invention will be better understood when read in light of the accompanying drawings in which.

DESCRIPTION OF THE PREFERRED EMBODIMENT

Figure 1:
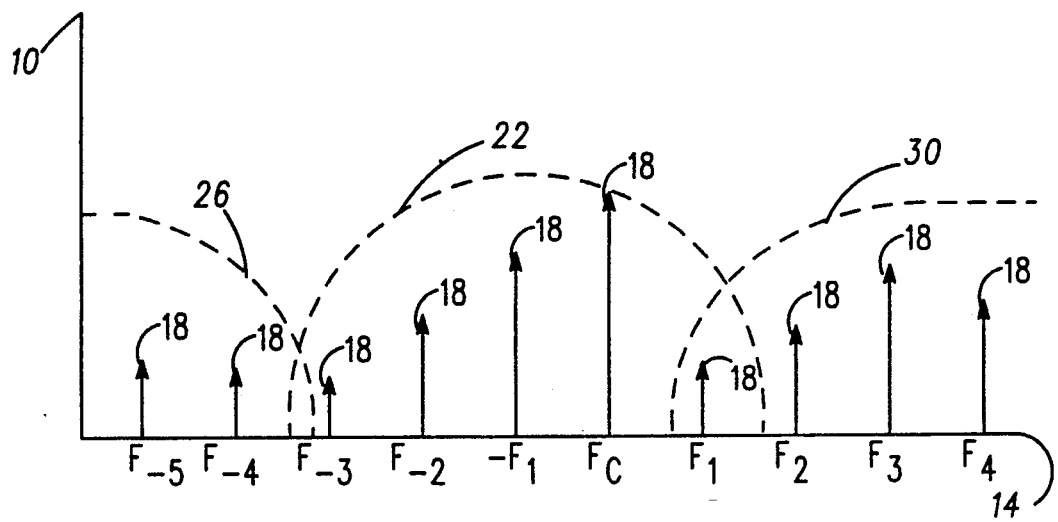
FIG. 1 is a graphical representation of a signal plotted as a function of frequency which may be filtered by the filter of the present invention.

Turning first to the graphical representation of FIG. 1, there is shown a representation of a typical signal plotted as a function of frequency. As illustrated, a typical signal is actually a multi-frequency signal, and is comprised of many different frequency components. The graph of FIG. 1 plots the magnitudes of the components of the signals at the various frequencies, scaled in terms of milliwatts on ordinate axis 10, as a function or frequency, scaled in terms of hertz, on abscissa axis 14.

The multi-frequency signal is represented by a plurality of single-tone spikes 18 of various frequencies. It is noted that, although the signal of FIG. 1 is represented by the plurality of single-tone spikes 18, an actual signal is comprised of a sum of signals having frequencies centered at the frequencies of spikes 18. Significant overlapping of such signals forms a resultant signal of a broad-bandwidth.

A filter functions to pass, or reject certain spectral (i.e., frequency) portions of a signal. Envelope 22, shown in hatch, represents a passband of a bandpass filter which passes spectral components of a signal within the passband of the filter; no other spectral components of the signal are passed. FIG. 1 further illustrates envelope 26, shown in hatch, representative of a lowpass filter. Spectral components of the signal within the passband of a lowpass filter are passed by the lowpass filter; no other spectral components of the signal are passed. Similarly, envelope 30, shown in hatch, is representative of the passband of a highpass filter. Spectral components of the signal within the passband of a highpass filter are passed by the highpass filter; no other spectral components of the signal are passed.

Figure 2:
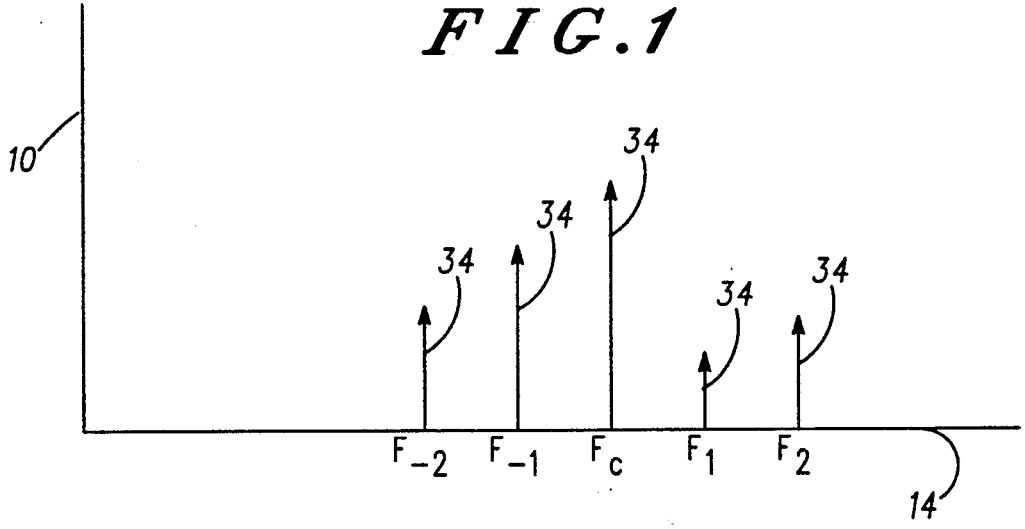
FIG. 2 is a graphical representation, similar to the graphical representation of the FIG. 1, but illustrating a filtered signal generated by one filter constructed by the teachings of the present invention.

FIG. 2 is a graphical representation, similar to that of FIG. 1, but illustrating the spectral components of the signal of FIG. 1 passed by a bandpass filter, having a passband represented by envelope 22 in FIG. 1. Spectral components of the signal supplied to the filter within the passband of the filter are passed; spectral components of the signal supplied to the filter outside of the passband of the filter are not passed. The filtered signal generated by the bandpass filter (i.e., the signal passed by the filter) is represented by single-tone spikes 34. Again, although the filtered signal is represented by single-tone spikes, an actual filtered signal is actually the resultant sum of signals having center frequencies at the frequencies of spikes 34. The filtered signal generated by a lowpass filter or a highpass filter represented by envelopes 26 and 30, respectively, may be similarly illustrated.

Figure 3:
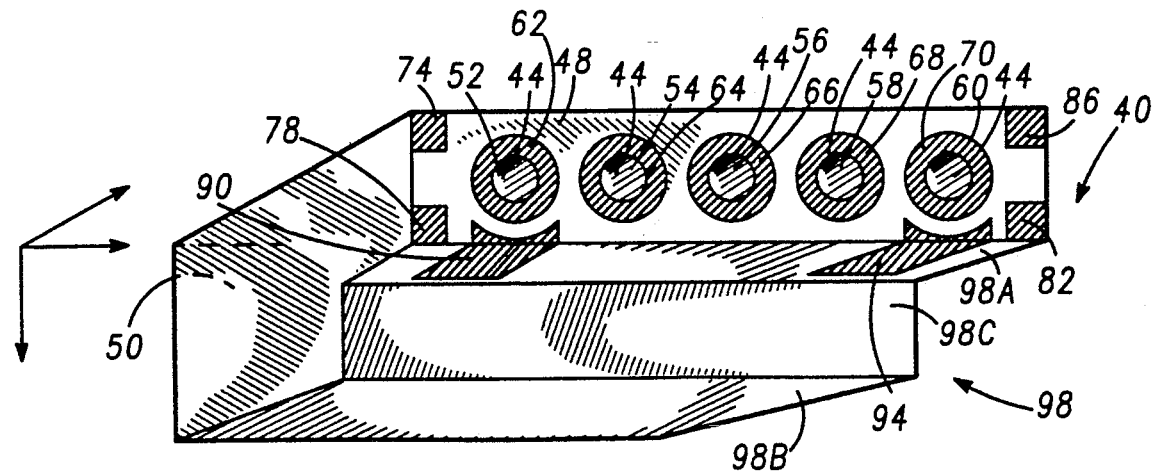
FIG. 3 is an orthogonal view of the filter constructed according to the teachings of the present invention.

Turning now to the orthogonal view of FIG. 3, there is shown a filter, referred to generally as reference numeral 40 of a preferred embodiment of the present invention. Filter 40, as illustrated, is generally block-like in construction; alternate geometric configurations are, however, similarly possible.

Filter 40 forms a dielectric block and is preferably comprised of a high-dielectric, low-loss ceramic material, such as, for example, a ceramic compound including barium oxide, titanium oxide, and/or zirconium oxide.

Formed, by a process of drilling or otherwise, to extend through at least a portion of the length of the body of dielectric block are cavities 44. Filter 40 contains at least one cavity 44 extending along at least a portion of the length of the body of filter 40; in the preferred embodiment of FIG. 3, filter 40 includes five cavities 44 extending between front surface 48 and rear surface 50. Each cavity 44 defines an opening on front surface 48. As illustrated, five cavities 44 define five openings 52, 54, 56, 58 and 60 on front surface 48.

Sidewalls which define cavities 44 are coated with an electrically conductive material, such as, for example, alloys of copper or silver. The electrically conductive material which coats the sidewalls defining cavities 44 further coats circumferential portions of openings 52-60 formed on front surface 48, and such coatings are represented in the Figure by rings 62-70. All surfaces of filter 40 except front surface 48 are similarly coated with an electrically conductive material.

Once the sidewalls which define cavities 44 are coated with the electrically conductive material, the cavities form resonators having resistive, capacitive, and inductive characteristics. The resistive, capacitive, and inductive characteristics of the resonators formed thereby may be altered by changing the amount of electrically conductive material of rings 62-70. Altering the resistive, capacitive, and/or inductive characteristics of the resonators formed by cavities 44 is referred to as tuning of the resonators. Cavities 44 form resonators which function as foreshortened transmission line resonators.

Preferably, peripheral portions of front surface 48 are additionally coated with an electrically conductive material. Corner portions 74, 78, 82, and 86 represent peripheral portions of front surface 48 which are coated with the electrically conductive material. Larger areas of peripheral portions of front surface 48 may be coated with the electrically conductive material as long as the peripheral portions are electrically isolated from rings 62-70 of electrically conductive material. Similarly, peripheral portions of rear surface 50 may be coated with the electrically conductive material.

Electrodes 90 and 94 are additionally formed on front surface 48 of filter 40. Rings 62-70 of electrically conductive material similarly form electrodes. Electrodes 90 and 94 are, however, spaced from the electrically conductive rings 62-70, and similar to rings 62-70, electrodes 90 and 94 are electrically isolated from peripheral portions 74-86.

The peripheral portions 74-86 of front surface 48 which are covered with the electrically conductive material are capacitively coupled to the rings 62-70. By alternately configuring rings 62-70 to form other geometric shapes, such as, for example, elliptical, or rectangular configurations, the characteristics of the capacitive couplings may be altered.

Bottom surface 98 of filter 40 forms a mounting surface which preferably, and as illustrated, is comprised of two surface portions 98A and 98B interconnected by stepped portion 98C. Surface portions 98A and 98B form planar surfaces which extend in parallel directions separated by the length of stepped portion 98C to form thereby a step surface of mounting surface 98. Portions of electrodes of 90 and 94 are additionally formed to extend along portions of surface portion 98A of the mounting surface 98. Portions of electrodes 90 and 94 formed on surface portion 98A are electrically isolated from the electrically conductive material which coats the majority of surface portions 98A-C of mounting surface 98. For reasons to be discussed hereinbelow, the length of stepped portion 98C separating surface portions 98A and 98B is carefully selected to maintain a predetermined spacing between surface portions 98A and 98B.

Figure 4:
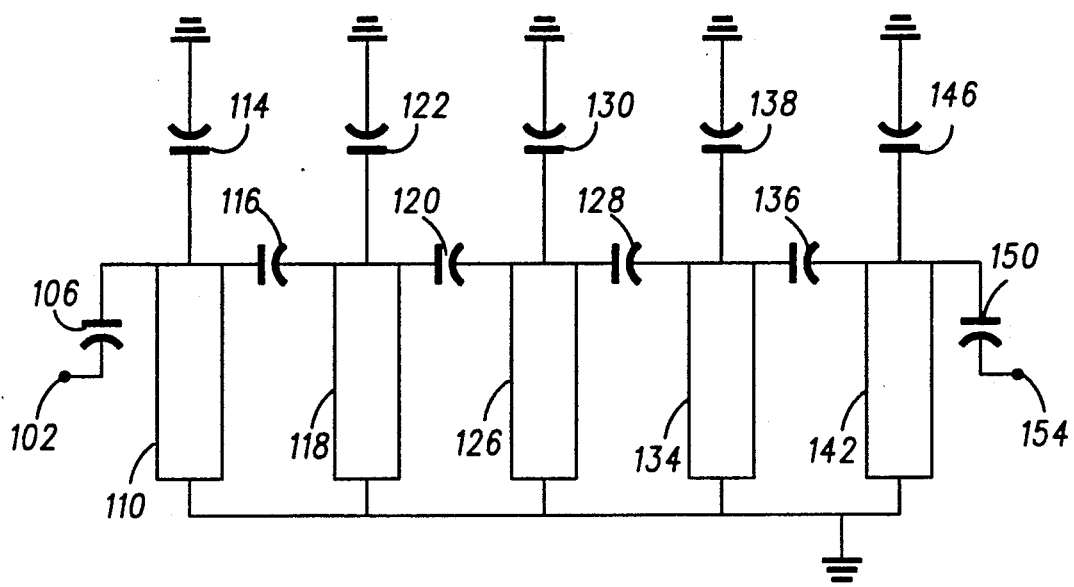
FIG. 4 is an electrical equivalent circuit of a filter constructed according to the teachings of the present invention.

Turning now to the electrical schematic circuit of FIG. 4, an electrical equivalent circuit of filter 40 is shown. An input signal is supplied to the circuit at node 102 which corresponds to electrode 90 of FIG. 3. A side of capacitor 106 is coupled to node 102, and corresponds with the capacitive coupling of electrode 90 and ring 62 formed on front surface 48 of filter 40. A second side of capacitor 106 is coupled to shorted transmission line 110.

Shorted transmission line 110 corresponds to a first resonator formed of a cavity 44 extending through filter 40. Shorted transmission line 110 is of a specific resistive, capacitive and inductive value. Shunt capacitor 114 extends between shorted transmission line 110 and ground, and corresponds to a capacitive coupling between ring 62 and peripheral portions 74-86 of filter 40 of FIG. 3. Shorted transmission line 110 is coupled, through capacitor 116, to shorted transmission line 118 which, similar to shorted transmission line 110 corresponds to a resonator formed of a cavity extending through filter 40 of FIG. 3. Shunt capacitor 122 extends between shorted transmission line 118 and ground, and is similar to capacitor 114, but corresponds to the capacitive coupling between ring 64 and peripheral portions 74-86 of filter 40.

In a similar manner, shorted transmission lines 126, 134 and 142, together with capacitors 120, 128, and 136, and shunt capacitors, 130, 138, and 146 correspond to resonators formed by cavities extending through filter 40, and capacitive couplings between rings 66-70 and peripheral portions 74-86. Capacitor 150 represents the capacitive coupling between electrode 94 and ring 70, and node 154 represents electrode 94 at which a filter output signal is generated by filter 40. Resonators 110, 118, 126, 134, and 142 are coupled to ground, as shown.

Figure 5:
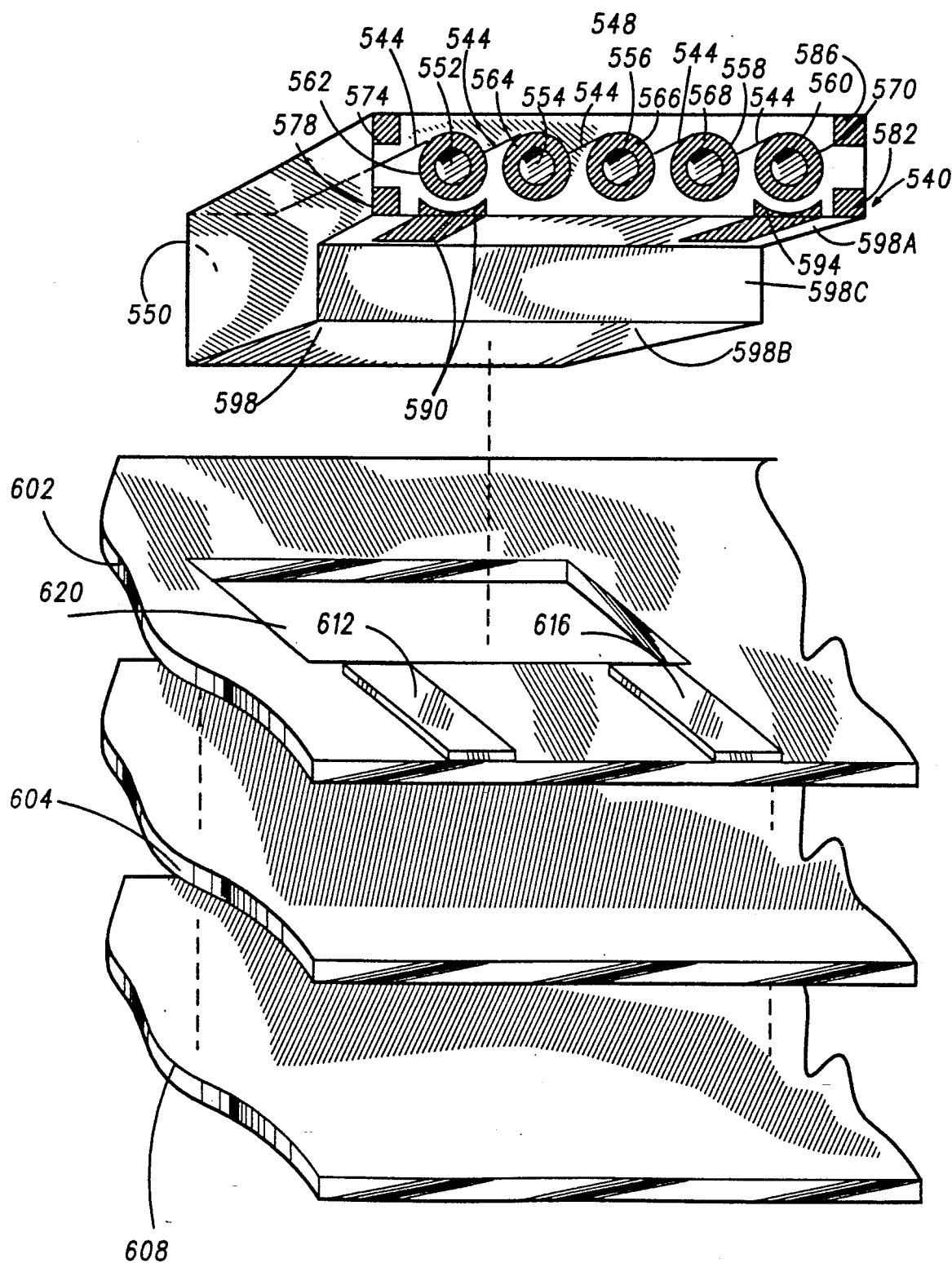
FIG. 5 is an exploded view of the present invention positioned above a circuit board permitting mounting of the filter of the present invention thereupon.

Turning now to the exploded view of FIG. 5, filter 540 of the present invention is positioned above a multilayer circuit board of which the layers thereof are also shown in exploded form. Filter 540 is identical in all respects to filter 40 of FIG. 3 and includes five cavities 544 formed to extend between front surface 548 and rear surface 550. Cavities 544 define openings 552-560 on front surface 548, and rings 562-570 of electrically conductive material surround openings 552-560. The electrically conductive material again coats the length of the sidewalls which define cavities 544. Peripheral portions 574-586 of front surface 548 are coated with an electrically conductive material as are the other surfaces of filter 540. Electrodes 590 and 594 are also formed of an electrically conductive material on front surface 548. Mounting surface 598, comprised of surface portions 598A-598C, is also coated with the electrically conductive material; portions of electrodes 590 and 594 are formed upon surface portion 598A and are electrically isolated from the electrically conductive material coated upon surface portion 598.

A cut-away portion of the multi-layer circuit board, shown in exploded form, is comprised of layer 602, layer 604, and layer 608. Layers 602 and 608 are comprised of an electrically non-conductive material, such as a thermoplastic material, and layer 604 is comprised of an electrically and thermally conductive material. Layer 604 is positioned between layers 602 and 608 (i.e., sandwiched between layers 602 and 608). One or more electrical circuits may be disposed upon layer 602 (and, additionally, upon layer 608) as is conventional of a printed circuit board.

Transmission lines 612 and 616, shown in hatch, form a portion of the electrical circuit disposed upon layer 602. Opening 620 is formed to extend through layer 602, and is of dimensions to permit surface portion 598B of mounting surface 598 to extend therethrough. Stepped portion 598C is of a length corresponding to the thickness of layer 602 such that when surface portion 598B is positioned to extend through openings 620, surface portion 598A abuts against a surface of layer 602. Transmission lines 612 and 616 are disposed upon the surface of layer 602 such that electrode 590 abuts against transmission line 612 and electrode 594 abuts against transmission line 616.

When surface portion 598B is positioned to extend through opening 620 of layer 602, surface 598B abuts against electrically and thermally conductive layer 604. Because surface portion 598B is coated with an electrically conductive material, when surface 598B abuts against layer 604, filter 540 is maintained in an electrical connection with layer 604. A bottom surface of layer 604 is positioned against layer 608 in a manner similar to the positioning of layer 602 against layer 604. Layer 602 may be laminated, or otherwise attached, to layer 604, and layer 604 may be laminated, or otherwise attached, to layer 608 to maintain layers 602-608 theretogether.

When filter 540 is suitably positioned such that surface portion 598B abuts against layer 604, the heightwise requirement of the filter above the surface of layer 602 is reduced by the thickness of layer 602. Filter 540, once inserted into opening 620, becomes self-aligning, and does not move during reflow solder operations. Additionally, because the abutment between surface portion 598B and layer 604 is a large area, a low impedance ground connection is formed. Still further, because of the large area abutment between the two surfaces, layer 604 functions well as a heat spreader of heat conducted thereto.

Figure 6:
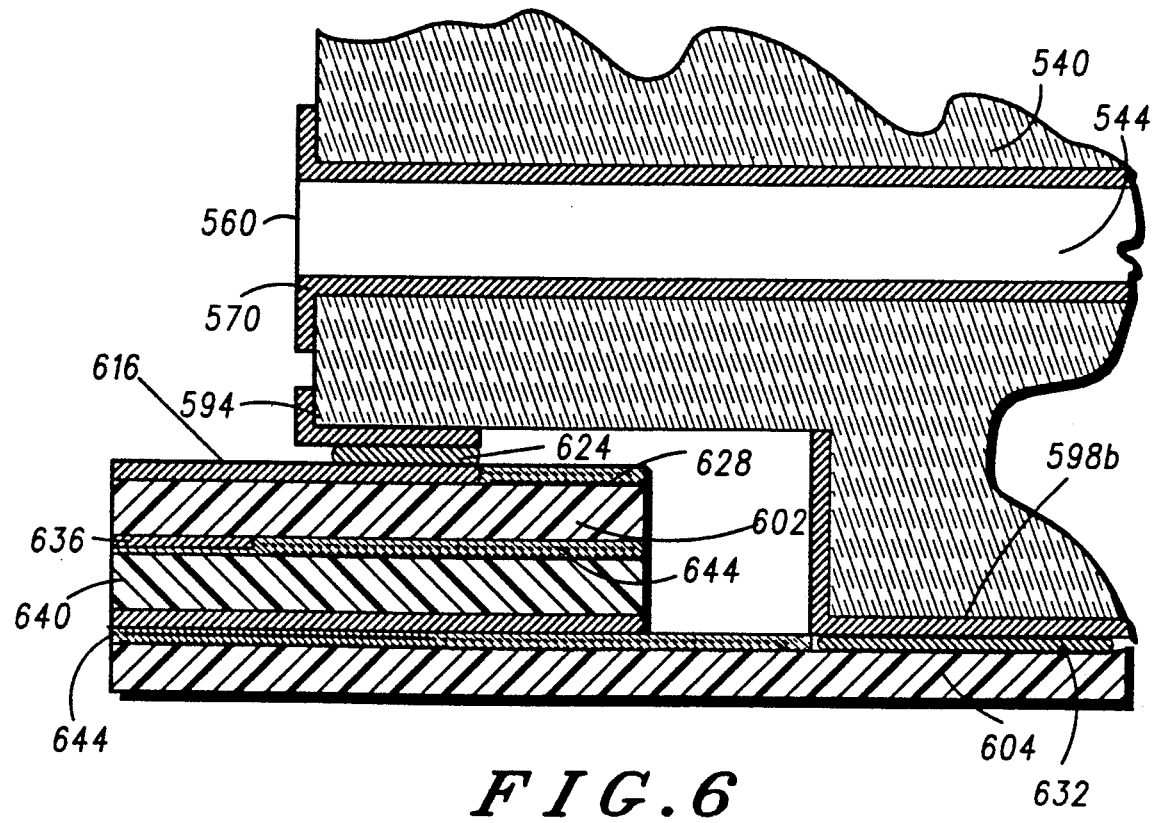
FIG. 6 is a cross-sectional view of the filter of FIG. 5 mounted upon a three-layer circuit board, illustrating the relationship between the filter of the present invention and the three-layer circuit board when the filter is mounted thereupon.

Turning now to the cross-sectional view of FIG. 6, filter 540 of FIG. 5 is mounted upon layers 602 and 604 of the multi-layer circuit board. Electrode 594 of filter 540 abuts against transmission line 616 disposed upon layer 602 of the circuit board to be electrically connected thereto. As illustrated, electrode 594 is connected to transmission line 616 through solder material 624 positioned by appropriate grooves formed in solder resist film 628 disposed upon the surface of layer 602. Surface portion 598B extends through opening 620 formed to extend through layer 602 such that surface portion 598B (coated with the electrically conductive material) abuts against the electrically and thermally conductive layer 604 through solder material 632. Layer 604 preferably acts as a ground plane to electrically ground the surface portions of filter 540 coated with the electrically conductive material. Because layer 604 is comprised of a thermally conductive material, layer 604 further functions as a heatsink to dissipate heat conducted thereto by the filter 540. The cross-sectional view of FIG. 6 further illustrates the capacitive coupling of electrode 594 to ring 570 surrounding opening 560 defined by cavity 544, bottom side metal interconnect layer 636 formed upon a bottom surface of layer 602, laminate insulate material 640 for isolating layer 602 from layer 604, and laminate material 644 for affixing laminate insulate material 640 to layers 602 and 604.

Figure 7:
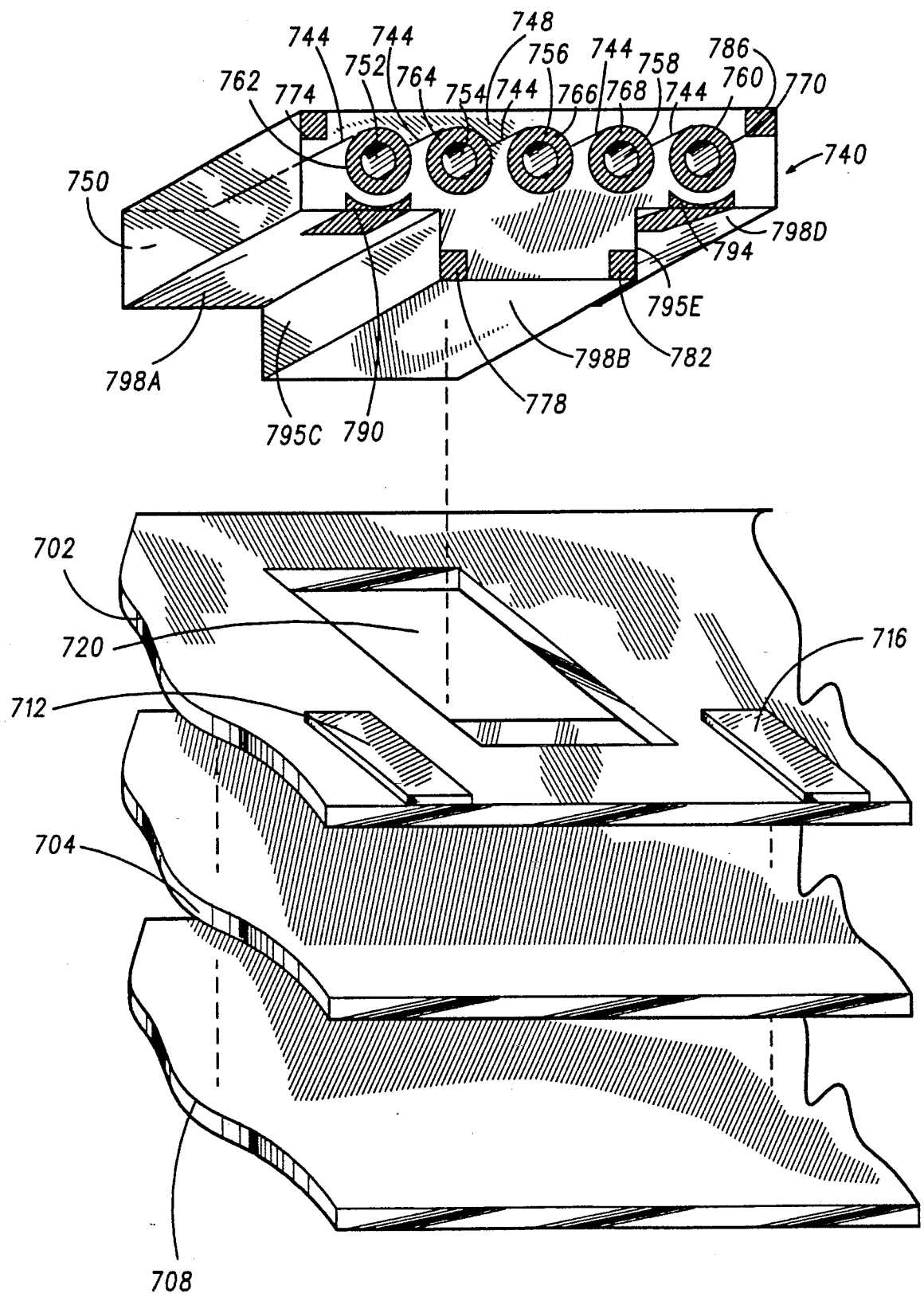
FIG. 7 is an exploded view, similar to that of FIG. 5, but illustrating an alternate embodiment of the filter of the present invention.

Turning now to the exploded view of FIG. 7, there is shown an alternate embodiment of the filter and filter assembly of the present invention. Filter 740 of FIG. 7 is similar to filter 540 of FIG. 5 and filter 40 of FIG. 3 in that filter 740 is comprised of a dielectric block having at least one cavity (and preferably, as illustrated, five cavities) 744 formed to extend therethrough to form a resonator(s) thereby. Cavities 744 extend from front surface 748 to rear surface 750. Cavities 744 define openings 752-760 on front surface 748. Rings 762-770 of electrically conductive material surround openings 752-760. The sidewalls defining cavities 744 are coated with an electrically conductive material. Peripheral portions of front surface 748, here indicated by peripheral portions 774, 778, 782, and 786, are also coated with an electrically conductive material. Electrodes 790 and 794 are further formed upon front surface 748.

Mounting surface 798 of filter 740 differs from the mounting surfaces of filters 540 and 40 in that mounting surface 798 is comprised of not only surface portions 798A and 798B, and stepped portion 798C, but additionally, surface portion 798D and stepped portion 798E. Stepped portion 798E is identical in dimensions to stepped portion 798C and is of precise, predetermined heightwise dimensions to space thereby surface portions 798B a predetermined distance from surface portion 798A and 798D. As illustrated, portions of electrodes 790 and 794 are formed on surfaces 798A and 798D.

The multi-layer circuit board is comprised of layers 702, 704, and 708 wherein layers 702 and 708 are comprised of a conventional, thermoplastic material, and layer 704 is comprised of an electrically and thermally conductive material. Layers 702 and 704, and layers 704 and 708 may be laminated, or otherwise attached, theretogether.

Disposed upon a surface of layer 702 is an electrical circuit of which transmission lines 712 and 716 form a portion. Opening 720 is formed to extend through layer 702, and is of dimensions to permit insertion of surface portion 798B of filter 740 therethrough. When surface 798B of filter 740 is inserted through opening 720, surface portions 798A and 798D abut against top surface of layer 702 such that electrode 790 is electrically connected to transmission line 712, and electrode 794 is electrically connected to transmission line 716. By analogy, surface portions 798A and 798D are identical in function to surface portion 598A of FIG. 5, but form a bifurcated surface. Surface portion 798B, which is coated with an electrically conductive material, abuts against electrically and thermally conductive layer 704. Similar to the embodiment of FIG. 5, layer 704 preferably comprises a ground plane for the circuit disposed upon layer 702, and functions as a ground plane for filter 740 when surface portion 798B is inserted through opening 720 to abut thereagainst.

When filter 740 is suitably positioned such that surface portion 798B abuts against layer 704, the heightwise requirement of the filter 740 above the surface of layer 702 is reduced by the thickness of layer 702.

Figure 8:
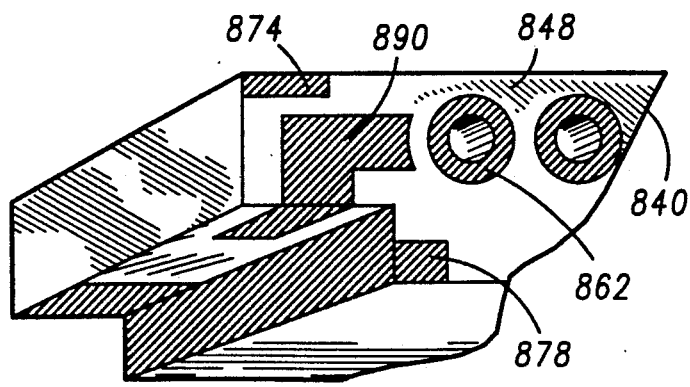
FIG. 8 is a cut-away view of a portion of another alternate embodiment of the filter of the present invention.

Turning now to the cut-away view of FIG. 8, there is shown another alternate embodiment of the filter of the present invention. The illustrated portion of filter 840 of FIG. 8 shows an alternate positioning of the electrode 890 formed upon front surface 848 of filter 840. The remaining illustrated portions of filter 840 are identical to corresponding portions of filter 740 of FIG. 7, and, accordingly, will not again be described in detail. The spacing between electrode 890, ring 862 of electrically conductive material and peripheral portions 874 and 878 of electrically conductive material forms a capacitive coupling of a value determined by the magnitude of the spacing, and the amount of electrically conductive material formed upon electrode 890, ring 862, and peripheral portions 874 and 878. Other arrangements of electrode 890, are, of course, similarly possible.

Figure 9:
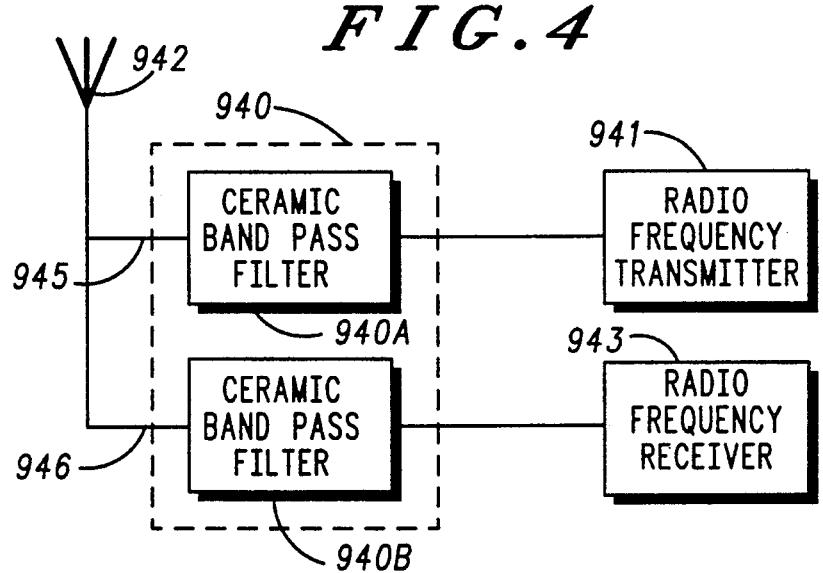
FIG. 9 is a block diagram of the filter of the present invention positioned to form a circuit forming a radiotelephone.

Turning now to the block diagram of FIG. 9 there is shown multiband filter 940, shown in hatch, constructed according to the teachings of the present invention and connected in a circuit forming a two-way radio, such as a radiotelephone. The radiotelephone may, for example, be similar to the radio transceiver shown and described in Motorola instruction manual number 68P8107E40, and entitled "DYNATAC Cellular Mobile Telephone," published by and available from Motorola C&E Parts, 1313 East Algonquin Road, Schaumburg, Ill., 60196. Filter 940 forms two intercoupled ceramic bandpass filters 940A and 940B. Two or more of the ceramic bandpass filters 940A and 940B may be intercoupled to provide apparatus that combines and/or frequency sorts two radio frequency signals into and/or from a composite radio frequency signal.

For example, and as illustrated by FIG. 9, filter 940 couples and transmits a signal from a radio frequency transmitter 941 to an antenna 942, and a receive signal from antenna 942 to a radio frequency receiver 943. The filter arrangement of FIG. 9 may be advantageously utilized in a mobile, portable, or fixed station radio as an antenna duplexer. A transmit signal from radio frequency transmitter 941 is coupled to filter portion 940A and thereafter by transmission line 945 to antenna 942. Filter 940A is a ceramic bandpass filter constructed according to the teachings of the present invention, such as the filters illustrated in FIGS. 3, 5, 7 and 8. The passband of filter 940A is centered about the frequency of the transmit signal from radio frequency transmitter 941, while at the same time greatly attenuating the frequency of the received signal. In addition, the length of transmission line 945 is selected to maximize the impedance thereof at the frequency of the received signal.

A received signal from antenna 942 of FIG. 9 is coupled by transmission line 946 to filter 940B and thereafter to radio frequency receiver 943. Filter 940B, which may be one of the filters constructed according to the teachings of the present invention and illustrated in FIGS. 3, 5, 7 and 8, has a passband centered about the frequency of the received signal, while at the same time greatly attenuating the transmit signal. Similarly, the length of transmission line 946 is selected to maximize the impedance thereof at the trasmit signal frequency for further attenuating the transmit signal.

While the present invention has been described in connection with the preferred embodiment shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A filter mountable upon a multi-layer circuit board having at least a top layer, a middle layer comprised of an electrically-conductive material, and a bottom layer for generating filtered signals of desired frequencies responsive to application of an input signal thereto, said filter comprising:

a dielectric block having means forming at least one cavity extending along at least a portion of the length of the dielectric block to form a resonator thereby, said dielectric block having at least one mounting surface for matingly engaging with a corresponding mating area formed of the top layer of the multi-layer circuit board to mount the dielectric block in position thereat; and means for supplying the input signal to the resonator of the dielectric block.

2. The filter of claim 1 wherein said dielectric block defines at least two opposing face surfaces and wherein the resonator is of a length of to extend between said two opposing face surfaces.

3. The filter of claim 2 wherein at least portions of said opposing face surfaces and sidewalls defining the resonator are coated with an electrically conductive material.

4. The filter of claim 3 wherein the electrically conductive material comprises a silver-containing material.

5. The filter of claim 1 wherein said means for supplying is capacitively coupled to the resonator formed by the means forming the cavity.

6. The filter of claim 1 wherein an electrical circuit is disposed upon at least one layer of the multi-layer circuit board.

7. The filter of claim 6 wherein the middle layer of the multi-layer circuit board is comprised of an electrically conductive plate member.

8. The filter of claim 7 wherein said electrically conductive plate member is coupled to the electrical circuit to form an electrical ground plane therefor.

9. The filter of claim 8 wherein said electrically conductive plate member is laminated to said at least one layer of the multi-layer circuit board upon which the electric circuit is disposed.

10. The filter of claim 1 wherein at least one layer of the multi-layer circuit board is comprised of a thermally conductive plate member to form a heat sink thereby.

11. The filter of claim 1 wherein said corresponding mated area formed of the top layer of the multi-layer circuit board comprises a cut-away portion to form a surface having a recessed area thereby.

12. The filter of claim 11 wherein at least a portion of the mounting surface of the dielectric block is of dimensions to extend into the recessed area formed by the cut-away portion of the top layer of the multi-layer circuit board.

13. The filter of claim 12 wherein the mounting surface of the dielectric block is comprised of a first mounting surface portion disposed upon a first plane and a second mounting surface portion disposed upon a second plane.

14. The filter of claim 13 wherein the first and second planes upon which the first and second mounting surface portions, respectively, are disposed to extend in parallel directions.

15. The filter of claim 14 wherein said mounting surface further comprises a stepped portion for interconnecting said first and second mounting surface portions thereby.

16. The filter of claim 15 wherein said second mounting surface portion extends into the recessed area, and said first mounting surface abuts against the top layer of the multi-layer circuit board to be supported thereagainst.

17. The filter of claim 16 further comprising means for coupling the means for supplying to the circuit disposed upon the circuit board.

18. The filter of claim 17 wherein said means for coupling comprises means forming transmission lines.

19. The filter of claim 1 wherein said dielectric block contains means forming first and second cavities to form first and second resonator tubes thereby.

20. The filter of claim 1 wherein said means for supplying comprises at least one capacitive coupling.

21. A filter assembly for generating filtered signals of desired frequencies responsive to application of an input signal thereto, said filter assembly comprising:
a multi-layer circuit board having at least one layer upon which an electrical circuit is disposed, at least one layer laminated thereto and being comprised of an electrically and thermally conductive plate member coupled to the electrical circuit to form an electrical ground plane therefor, and at least one layer containing a cut-away portion to form a surface having a recessed area forming a support surface thereby;
a dielectric block having means forming at least one cavity extending along at least a portion of the length of the dielectric block to form a resonator thereby, said dielectric block having at least one mounting surface formed of a first mounting surface portion disposed upon a first plane and a second mounting surface portion disposed upon a second plane for matingly engaging with the support surface of the circuit board to mount the dielectric block in position thereat; and
means for supplying the input signal to the resonator of the dielectric block.

22. The filter assembly of claim 21 wherein said dielectric block defines at least two opposing face surfaces and wherein the resonator is of a length to extend between said two opposing face surfaces.

23. The filter assembly of claim 22 wherein at least portions of said opposing face surfaces and sidewalls defining the resonator are coated with an electrically conductive material.

24. The filter assembly of claim 23 wherein the electrically conductive material comprises a silver-containing material.

25. The filter assembly of claim 21 wherein said means for supplying is capacitively coupled to the resonator formed by the means forming the cavity.

26. The filter assembly of claim 21 wherein the first and second planes upon which the first and second mounting surface portions, respectively, are disposed to extend in parallel directions.

27. The filter assembly of claim 26 wherein said mounting surface further comprises a stepped portion for interconnecting said first and second mounting surface portions thereby.

28. The filter assembly of claim 27 wherein said second mounting surface portion extends into the recessed area, and said first mounting surface abuts against the top layer of the multi-layer circuit board to be supported thereagainst.

29. The filter assembly of claim 28 further comprising means for coupling the means for supplying to the circuit disposed upon the circuit board.

30. The filter assembly of claim 29 wherein said means for coupling comprises means forming transmission lines.

31. A surface-mount filter mountable upon a multi-layer circuit board having at least a first layer having an electrical circuit disposed thereupon and a second, electrically conductive layer positioned beneath the first layer and laminated thereto wherein said first layer contains a cut-away portion forming a recessed area; said filter formed of a dielectric block having means forming at least one cavity extending along at least a portion of the length of the dielectric block to form a resonator thereby, said dielectric block having at least one mounting surface permitting mounting thereof at the recessed area formed by the cut-away portion of the first layer such that at least a portion of said mounting surface abuts against the second, electrically conductive layer of a mounting surface of the dielectric block; and means for supplying an input signal to the resonator of the dielectric block.

32. A two-way radio for transmitting and receiving signals, said two-way radio comprising:
a transmitter portion;
a receiver portion;
a multi-layer circuit board having at least a top layer, a middle layer comprised of an electrically-conductive material, and a bottom layer, said transmitter portion and said receiver portion being disposed upon at least one of the layers of the multi-layuer circuit board;
an antenna for radiating a signal supplied thereto and for receiving a signal transmitted thereto; and
a dielectric filter interconnecting the transmitter portion and the antenna for supplying a filtered, transmit signal to the antenna, and interconnecting the receiver portion and the antenna for supplying a filtered, receive signal to the receiver portion, said dielectric filter mountable upon a surface of the top laye of the multi-layer circuit board and comprised of a dielectric block having means forming at least one cavity extending along at least a portion of the length of the dielectric block to form a resonator thereby, wherein said dielectric block has at least one mounting surface for matingly engaging with a corresponding mating area formed of the top layer of the circuit board to mount the dielectric block in position thereat.

33. A dielectric block filter for forming a filtered signal responsive to application of an input signal thereto, said filter comprising:

- means forming at least one resonating cavity defined by sidewalls extending longitudinally between a first side surface and a second side surface, respectively, of the dielectric block, said sidewalls defining the at least one resonating cavity being coated with an electrically conductive material; and
- a bottom surface formed beneath the at least one resonating cavity, said bottom surface having a first planar surface portion disposed in a first plane and a second planar surface portion disposed in a second plane;
- electrodes formed upon said first planar surface portion, said electrodes having electrode portions extending to the first side of the dielectric block, said electrodes for permitting electrical connection thereof to transmission lines formed upon a top layer of a multi-layer circuit board when the first planar surface of the bottom surface is aligned with the circuit board and positioned in abutting engagement thereagainst, and said electrode portions extending to the first side of the dielectric block being capacitively coupled to the electrically conductive material coating the at least one resonating cavity; and
- said second planar surface forming a mounting surface for matingly engaging with a recessed area formed upon the top layer of the multi-layer circuit board.

* * * * *